United States Patent [19]

Przybilla et al.

[11] Patent Number: 5,525,453
[45] Date of Patent: Jun. 11, 1996

[54] POSITIVE-WORKING RADIATION-SENSITIVE MIXTURE

[75] Inventors: Klaus J. Przybilla, Frankfurt, Germany; Takanori Kudo, Saitama, Japan; Seiya Masuda, Saitama, Japan; Yoshiaki Kinoshita, Saitama, Japan; Natumi Suehiro, Saitama, Japan; Munirathna Padmanaban, Saitama, Japan; Hiroshi Okazaki, Saitama, Japan; Hajime Endo, Saitama, Japan; Ralph Dammel, Flemington, N.J.; Georg Pawlowski, Wiesbaden, Germany

[73] Assignee: Hoechst Japan Limited, Tokyo, Japan

[21] Appl. No.: 196,810

[22] Filed: Feb. 15, 1994

[30] Foreign Application Priority Data

Feb. 15, 1993 [JP] Japan .................. 5-025751
Feb. 15, 1993 [JP] Japan .................. 5-025753

[51] Int. Cl.$^6$ ........................................ G03F 7/021
[52] U.S. Cl. .............. 430/170; 430/191; 430/270.1; 430/271.1
[58] Field of Search ................... 430/270, 271, 430/191, 170

[56] References Cited

U.S. PATENT DOCUMENTS 4,491,628  1/1985  Ito et al. ................... 430/191

FOREIGN PATENT DOCUMENTS 4051243  2/1992  Japan .

*Primary Examiner*—Charles L. Bowers, Jr.
*Assistant Examiner*—Christopher G. Young
*Attorney, Agent, or Firm*—Foley & Lardner

[57] ABSTRACT

A novel positive-working radiation-sensitive mixture having a high sensitivity to radiation in a short-wavelength UV region is provided which can be developed in an aqueous alkaline solution, has a stable acid latent image and is used for the production of a semiconductor. The mixture comprises, as indispensable components, a) a binder insoluble in water but soluble in an aqueous alkaline solution, b) a compound having at least one bond cleavable with an acid, c) a compound capable of producing an acid upon radiation, and $d_1$) a basic ammonium compound or $d_2$) a basic sulfonium compound.

20 Claims, No Drawings

POSITIVE-WORKING RADIATION-SENSITIVE MIXTURE

BACKGROUND OF THE INVENTION

The present invention relates to a resist material sensitive to active beam irradiation, particularly a positive-working radiation-sensitive mixture.

The radiation-sensitive mixture is already known by itself. In particular, a positive-working mixture is commercially used as a resist material comprising, besides o-quinonediazide, a binder soluble in an aqueous alkaline solution, such as poly(4-hydroxystyrene) or novolac. However, this system is unsatisfactory in the sensitivity and resolution to radiation, particularly radiation in a short wavelength region. Novolac is unsuitable as a binder in a single layer resist material for deep UV (220–300 nm) because it has a high natural absorption in an UV-2 region (220–300 nm). On the other hand, poly(hydroxystyrene) (PHS) has more advantageous absorption properties in the UV region, a higher heat stability and a better dry etching resistance.

The positive-working radiation-sensitive mixture for UV-2, wherein PHS is used as a binder having a side group sensitive to an acid, is known from, for example, U.S. Pat. No. 4,491,628. It is also known that the sensitivity to radiation of the radiation-sensitive mixture can be enhanced by the addition of a compound which releases, upon exposure to radiation, an acid which has a catalytic action on the secondary reaction. Examples of the compound capable of forming a strong acid upon being exposed to radiation include a diazonium salt, a phosphonium salt, a sulfonium salt, an iodonium salt, a nitrobenzyl ester, a phenolic methanesulfonate, a diazo compound, a halogen compound, a bis-sulfonylmethane compound and a bis-sulfonyldiazomethane compound.

A positive-working radiation-sensitive mixture comprising a PHS copolymer, an acid generating compound and a N,O-acetal oligomolecule dissolution inhibitor is described by H. Roeschert et al. in "Critical Process Parameters of an acetal-based deep-UV photoresist", [Advances in Resist Technology and Processing IX, edited by Anthony E. Novembre, Proc. SPIE 1672, 33–45 (1992)]. The latent acid image of this photosensitive mixture is unfavorably unstable. The problem of the unstability of the acid latent image is a fundamental problem of new resist materials that function on the principle of a chemical amplification. This problem is fully discussed in technical literatures, for example, "Airborn chemical contamination of a chemically amplified resist", S. A. MacDonald et al., "Advance in Resist Technology and Processing VIII", edited by Hiroshi Itoh, Proc. SPIE 1466, 2–12 (1991). Further, studies by L. Schlegel show a problem of diffusion in chemically amplified resist materials (see L. Schlegel et al., Jap. Journ. of Applied Physics Series 5, Proc. of 1991 International Microprocess Conference, pp. 175–180). In a high-resolution resist for 248 nm, the average moving radius of the acid serving as a catalyst is the same as that of the size of the structure to be resolved. A method for determining the diffusion length and diffusion constant in chemically amplified resist materials is described by J. Nakamura in Jap. Journ. of Applied Physics (vol. 30, No. 10, October 1991, pp. 2619–2625). In a chemically amplified system very sensitive to a change in an acid latent image due to a low active energy barrier, the fundamental physical phenomenon limits the resolution. When no additive is used, the resists described by H. Roeschert et al. in [Advances in Resist Technology and Processing IX, edited by Anthony E. Novembre, Proc. SPIE 1672, 33–45 (1992)] have the following unfavorable properties due to the problem of diffusion.

1) The resolution is only down to 0.5 μm.
2) A high resolution can be achieved only by an unfavorable deviation from a linearity.
3) The latitude of exposure is very small.
4) The stability of the latent image due to holding time between the exposure and the subsequent baking after exposure is so low that the line slimming in a nonexposed resist region is remarkably large.

DISCLOSURE OF THE INVENTION

An object of the present invention is to provide a novel positive-working radiation-sensitive mixture having a high sensitivity to radiation in a short-wavelength UV region which can be developed in an aqueous alkaline solution, has a stable acid latent image and is used for the production of a semiconductor.

The above-described object can be attained by a radiation-sensitive mixture according to the present invention comprising, as indispensable components, a) a binder insoluble in water but soluble in an aqueous alkaline solution, b) a compound having at least one bond cleavable with an acid, c) a compound capable of producing an acid upon radiation, and $d_1$) a basic ammonium compound.

Each of the components a) to d) is used alone or in the form of a mixture of two or more of them.

BEST MODE FOR CARRYING OUT THE INVENTION

First Invention

The positive-working radiation-sensitive mixture according to the first invention comprises, as indispensable components, a) a binder insoluble in water but soluble in an aqueous alkaline solution, b) a compound having at least one bond cleavable with an acid, c) a compound capable of producing an acid upon radiation, and $d_1$) a basic ammonium compound.

Each of the components a) to $d_1$) is used alone or in the form of a mixture of two or more kinds of the compounds.

The content of the basic ammonium compound as the component as the component $d_1$) is 0.01 to 1.00 molar equivalent based on the maximum amount of an acid theoretically produceable from the compound c).

Such compound $d_1$) is known, for example, as a phase transfer catalyst and commercially available as an aqueous solution of ammonium hydroxide or a methanol solution. The addition of this basic compound to a resist solution gives rise to the formation of a phenolate anion in the resist matrix, and the anion neutralizes the acid which diffuses into the nonexposed area. Therefore, in the present invention, use of an ammonium additive in the radiation-sensitive mixture is very useful for controlling the diffusion of an acid.

Use of the ammonium additive in the radiation-sensitive mixture is known from, for example, Japanese Patent Laid- Open No. 51243/1992. Japanese Patent Laid-Open No. 51243/1992 discloses only the addition of an alkylammonium compound in a small amount, that is, 0.01 to 1% by weight, based on the acid generator, to the resist composition. In this case, the action of the ammonium additive is merely associated with properties which increase the contrast and differentiates the solubility.

Ammonium compounds capable of satisfying all the following requirements are favorable in the present invention.

1) The solubility in the resist is satisfactory.
2) The heat stability is satisfactory.
3) The basic counter ion is satisfactory.

The basic ammonium compound $d_1$) is a quaternary ammonium salt represented by the general formula I:

$$[NR^1R^2R^3R^4]^+X_1^{-tm}\quad I$$

wherein $R^1$ to $R^4$ each independently represent a $C_1$–$C_{18}$ alkyl, cycloalkyl, alkylaryl or aryl group, provided that one or more aliphatic $CH_2$ group thereof may be substituted with an oxygen atom; and $X_1$ represents a basic anion having a $pK_B$ value of –3 to +5.

Particularly favorable compounds are ammonium compounds represented by the general formula I wherein $R^1$ to $R^4$ each independently represent methyl, ethyl, propyl, isopropyl, butyl, dodecyl, phenyl or benzyl; and $X_1$ is a hydroxyl group or OR' (wherein R' represents a $C_1$–$C_4$ alkyl), OCOR" (wherein R" represents a $C_1$–$C_{10}$ alkyl or aryl) or OCOO—.

It is surprising that in addition to alcoholates having a negative $pK_B$ value and hence capable of forming in the resin matrix a polyphenolate anion and strong basic anions, such as carbonates or hydroxides, weak basic anions, for example, acetates, or general carboxylic acid anions are also favorable for buffering the nonexposed resist region to stabilize the acid latent image. The acetate buffer is not a catalyst useful for acetal hydrolysis.

The radiation-sensitive mixture is formulated in a nonpolar solvent such as propylene glycol monomethyl ether acetate (PGMEA) or ethylene glycol monomethyl ether acetate. For this reason, methanol or water is replaced with PGMEA. This is advantageous for the production of the ammonium acetate solution because an ester cleaving reaction occurs with a solvent under basic conditions.

Second Invention

The positive-working radiation-sensitive mixture according to the second invention comprises, as indispensable components, a) a binder insoluble in water but soluble in an aqueous alkaline solution, b) a compound having at least one bond cleavable with an acid, c) a compound capable of producing an acid upon radiation, and $d_2$) a basic sulfonium compound.

Each of the components a) to $d_2$) is used alone or in the form of a mixture of two or more kinds of the compounds.

The basic sulfonium compound as the component $d_2$) is preferably a member selected from the group consisting of compounds represented by the following formulae II to V:

$$[SR^5R^6R^7]^+X_2^-\quad II$$

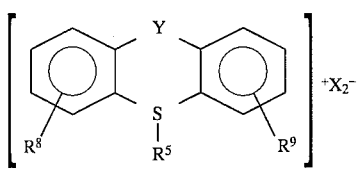

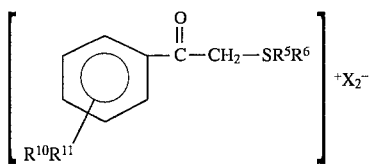

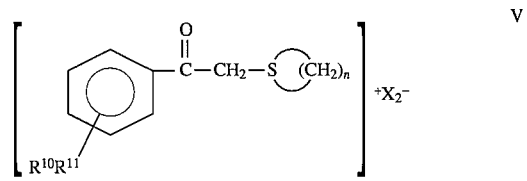

wherein $R^5$, $R^6$ and $R^7$ each independently represent a $C_1$–$C_{18}$ alkyl, aryl or heteroaryl group or an aryl group mono-, di- or tri-substituted with an alkyl, an alkylaryl, an aryl, a halogen, an alkoxy, a phenoxy, a thiophenol, a phenylsulfonyl or a phenylsulphenyl;

Y represents $[CH_2]_n$ wherein n is 0 or 1, O or S;

$R^8$ and $R^9$ represent a $C_1$–$C_4$ alkyl, alkoxy or a halogen;

$R^{10}$ and $R^{11}$ represent a $C_1$–$C_4$ alkyl, alkoxy or a halogen;

n is 5 or 6; and $X_2$ represents a basic anion having a $pK_B$ value of –3 to +5.

The content of the basic sulfonium compound as the component $d_2$) is 0.01 to 2.00 molar equivalent based on the maximum amount of an acid theoretically produceable from the compound c).

Sulfonium compounds capable of satisfying all the following requirements are suitable.

1) The solubility in the resist is satisfactory.
2) The heat stability is satisfactory.
3) The basic counter ion is satisfactory.

Particularly preferred examples of the sulfonium compound include sulfonium salts represented by the general formulae (II) to (V) wherein $R^5$, $R^6$ and $R^7$ each independently represent methyl, ethyl, propyl, isopropyl, butyl, phenyl, biphenyl, tolyl, xylyl, chlorophenyl, bromophenyl, methoxyphenyl, ethoxyphenyl, propyloxyphenyl, butyloxyphenyl, tert-butyloxyphenyl, phenoxyphenyl, thiophenoxyphenyl or phenylsulfonylphenyl; Y represents $[CH_2]_n$ wherein n is 0 or 1, O or S; $R^8$ and $R^9$ represent a $C_1$–$C_4$ alkyl, methoxy, ethoxy, chlorine or bromine; $R^{10}$ and $R^{11}$ represent a $C_1$–$C_4$ alkyl, methoxy, ethoxy, chlorine or bromine; n is 5 or 6; and $X_2$ represents a hydroxyl group or OR (wherein R represents a $C_1$–$C_4$ alkyl), OCOR (wherein R represents a $C_1$–$C_{10}$ alkyl, aryl or alkylaryl) or OCOO—.

The sulfonium salts are well known from technical literatures and technically very important as a photochemical polymerization catalyst. Use of the sulfonium salt in radiation-sensitive mixtures is described in, for example, U.S. Pat. No. 4,491,628. Use of onium salts in resist materials is roughly described by Crivello in Org. Coatings and Appl. Polym. Sci., 48, 65–69 (1985). The synthesis and optical properties of the onium salts are summarized in "Cationic Polymerization-Iodonium and Sulfonium Salt Photoinitiators", J. V. Crivello, Advances in Polymer Science 62, verlag, Berlin, Heidelberg 1984. The results of intensive mechanismic studies on a mechanism, through which a sulfonium salt compound forms an acid, is reported by J. L. Dectar and N. P. Hacker in Journal of American Chemical, Society 1990, 112, 6004–6015.

An attempt to produce sulfonium hydroxides from sulfonium halide with silver oxide is reported in Journal of American Chemical Society 73(1951), p. 1967. These compounds are in the form of an unstable oil that decomposes immediately even at room temperature with redolence of sulfide.

In this connection, it has been surprisingly found that the unstability of triphenylsulfonium hydroxide described in the literature is not applied to a solution of the compound in polar and nonpolar solvents.

Further, the present inventors have developed a method for preventing the contamination of the compound with a metallic ion in the production of desired sulfonium hydroxides. This method is very important for using the radiation-sensitive mixture of the present invention in semiconductor technology. Ion-exchange chromatography is used in a polar or nonpolar eluent. In this case, use of an Amberlyst resin having a quaternary ammonium group as an ion-exchange resin is preferred. In principle, the ion-exchange resin can be converted to a basic form with a solution of a proper tetraalkylammonium having a basic counter ion. Tetramethylammonium hydroxide is particularly suitable. Water, alcohols, tetrahydrofuran and nonpolar organic solvents are suitable as the eluent. Methanol or ethanol is particularly preferred.

As a general rule, corresponding halides are used in the production of sulfonium hydroxides. It is also possible to use other anions, for example, metal fluorides, tetrafluoroborates, hexafluorophosphates and alkyl or fluorinated alkyl sulfonate of complexes. The sulfonium salt is dissolved in a small amount of an eluent and then applied to an ion-exchange column. The elution rate is substantially lower than that of the exchange of a strong electrolyte by ion-exchange chromatography although it depends upon the dimension of the column and load. This is because in order to reach an equilibrium in the theoretical standard, a lot of time is required as compared with the case where the compound is strongly dissociated in an eluent.

The content of the base in the eluted volume is determined by titration and in agreement with the theoretical value. The titration curve of triphenylsulfonium hydroxide in water/methanol with 0.1N HCl exhibits a clear buffer property in a region of pH=7. Therefore, triphenylsulfonium hydroxide is in an amphoteric molecule form rather than an expected strong electrolyte.

A percentage ion exchange of 99.8% can be attained by the above method. Other properties of the basic sulfonium salt solution can be examined by Uv spectroscopy. No change in the position of the maximum absorbance and the maximum absorbance value is observed as compared with those of the nonbasic sulfonium salt used. Therefore, the influence of this anion on the absorption properties of the sulfonium chromophore is small.

Then, the eluent can be evaporated in vacuo to replace it with other suitable solvents.

This method enables a solution having a particular sulfonium hydroxide concentration to be prepared in a solvent suitable for the formulation of a resist.

That the concentration of sulfonium hydroxide in the solution is constant can be proven by determining the base content by titration at various time intervals.

As described above, the process of the present invention regarding the basic sulfonium salt is not limited to the production of hydroxides, and other basic and nonbasic solutions may also be produced by ion-exchange chromatography depending upon the $pK_B$ value of the anion. The hydroxides can be converted to all other basic and nonbasic compounds particularly simply by adding conjugated acids.

1) $[Ph_3S]^+(OH)^- + HO-aryl \rightarrow [Ph_3S]^{+-}O-aryl$
2) $[Ph_3S]^+(OH)^- + HO-CO-R \rightarrow [Ph_3S]^{+-}O-CO-R$
3) $[Ph_3S]^+(OH)^- + HO-SO_2-R \rightarrow [Ph_3S]^{+-}O-SO_2-R$ Sulfonium salts having a desired anion can be very simply prepared by the above-described method, i.e., by using a properly prepared ion-exchange column or by titrating the hydroxide solution with a corresponding conjugate acid.

The above-described method has the following technical advantages.

1) Operation can be effected without involving a metal ions.
2) A sulfonium salt, which is unstable in an isolated form, is produced and can be used in a radiation-sensitive mixture.
3) A sulfonium salt, which cannot be produced in a pure form, is produced and can be used in a radiation-sensitive mixture.

The process for producing a basic sulfonium hydroxide solution is suitable particularly for simply producing a sulfonium acetate solution by hydrolysis of an ester. Propylene glycol monomethyl ether acetate (PGMEA) is a preferred solvent for resist technology. The replacement of the eluent for the basic sulfonium hydroxide solution with PGMEA causes ester cleaving of the solvent, so that the production is completed in a short time.

The basic anion causes an acid-base reaction with a phenolic binder in a resist matrix to form a polyphenolate anion that neutralizes an acid which is being diffused into the nonexposed area.

It is surprising that weak basic anions, such as acetates, or general carboxylic acid anions are also favorable and buffers the acid being diffused into the nonexposed area and do not catalyze the acetal hydrolysis.

This stabilizes an acid latent image, improves the resolution in lithography, enhances the stability during the period between exposure and development and increases the processing tolerance (exposure latitude).

The addition of a basic compound to the radiation-sensitive mixture to be chemically amplified causes the base to neutralize the acid being diffused into the nonexposed area but also the acid present in the exposed area and hence gives rise to contradiction. However, the presence of an acid is necessary for differentiating the solubility.

The technical advantage of the basic sulfonium hydroxide over the nonphoto active basic additive is that the basic sulfonium hydroxide, as such, is photo active and neutralized in the exposed area. For this reason, it becomes possible to add a large amount of the base to a resist without loss of the sensitivity to radiation.

In the first and second inventions, a binder containing a phenolic hydroxyl group is suitable as the binder, and poly(hydroxystyrene) is particularly suitable because it has a high thermal stability, a good etch resistance and a high UV transparency in a 248 nm region. Particularly preferred examples of the binder include poly(4-hydroxystyrene) and a copolymer thereof with an alkyl-substituted 4-hydroxystyrene. Copolymers, i.e., poly[4-hydroxystyrene-co-4-hydroxy-3-methylstyrene] and poly[4-hydroxystyrene-co-4-hydroxy-3,5-dimethylstyrene, are particularly preferred. The monomer ratio may be varied in a range of from 10 to 90%. However, in order to obtain an optimal dissolution property, the monomer ratio is particularly preferably in the range of from 2:1 to 1:2. The solubility thereof in the aqueous alkali developer is most important to the polymer matrix. The molecular weight $M_W$ may be in the range of from 3,000 to 100,000 Dalton, preferably in the range of from 8,000 to 30,000, and the degree of dispersion should be 2 or less.

The adjustment of the hydrophilicity of the resist matrix is effected by mixing poly(4-hydroxystyrene) with other phenolic binders. Alkyl-substituted polyvinyl phenols, particularly poly(4-hydroxy-3-methylstyrene) and novolac are also favorable as other phenolic binders which may be mixed with PHS.

A compound having at least one C—O—C or C—N—C bond is preferred as the compound having at least one bond cleavable with an acid. Preferred examples thereof include compounds represented by the following general formula (VI):

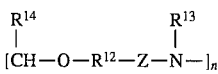

wherein $R^{12}$ represents a $C_1$–$C_4$ alkylene group, $R^{13}$ represents a $C_1$–$C_4$ alkyl group, $R^{14}$ represents a $C_1$–$C_{10}$ alkyl or aryl group, Z represents a —CO—, —O—CO— or —NH—CO— group, and n is an integer more than 1.

Chemically, poly-N,O-acetal produced by an acid catalized trans esterification with a corresponding alcohol component and a dimethyl acetal of a corresponding aldehyde are important. The degree of condensation and molecular weight distribution are adjusted by varying polycondensation conditions.

Suitable examples of the acid generating compound include diazonium salts, iodonium salts, sulfonium salts, halides and o-quinonediazidosulfonic acid esters. The above-described onium salts are usually used in a form soluble in organic solvents, in many cases, as a tetrafluoroborate, a hexafluorophosphate, a hexafluoroantimonate or a hexafluoroarsenate, or a sulfonate, for example, a trifluoromethylsulfonate or a hexafluoropropylsulfonate. Among the halogen compounds, triazine, oxazole, oxadiazole, thiazole and 2-pyrone substituted with a trichloromethyl group and/or a tribromomethyl group are preferred. In addition, halogenated, particularly chlorinated and brominated aromatic compounds too are favorable as the acid generator.

Compounds capable of generating a sulfonic acid, having a good thermal stability and exhibiting an advantageous absorption property in a 248 nm region are preferred.

Phenolic sulfonic acid esters, bis-sulfonylmethanes or bis-sulfonyldiazomethanes represented by the general formula VII are particularly preferred because they exhibits a high acid generation efficiency and a high transparency in a DUV region:

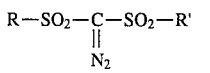

wherein R and R' each independently represent an alkyl, cycloalkyl, aryl, heteroaryl, or halogenated aryl group.

Sulfonium-sulfonates, such as triarylsulfonium-sulfonate, and bis-(4-chlorophenylsulfonyl)diazomethane are particularly favorable. The above-described sulfonium-sulfonate can be provided, for example, by adding a sulfonic acid to a basic sulfonium salt solution, and more specific examples thereof include triphenylsulfonium-sulfonates. Addition of a sulfonic acid to an excess amount of basic sulfonium salt solution results in the in-situ mixture of sulfonium-sulfonate as a photo active compound and a sulfonium salt as an additive. Examples of the sulfonic acid used herein include an alkylsulfonic acid, a partially or entirely fluorinated alkylsulfonic acid, an arylsulfonic acid or an arylsulfonic acid substituted with a halogen, an alkyl, an alkoxy, nitro, cyano or an alkyl halide. The content of the compound c) is in the range of from 1 to 10% by weight based on the solid content. In some cases, a mixture of photo active compounds of one kind or a plurality of kinds has advantageous proprieties in the resist.

A mixture comprising the components a) to $d_1$) or $d_2$) according to the present invention is dissolved in an organic solvent in such a manner that the solid content is generally in the range of from 5 to 40% by weight. Aliphatic ketones, ethers and esters and any mixture thereof are preferred as the solvent. Particularly preferred solvents include alkylene glycol monoalkyl ethers, such as 1-methoxy-2-propanol, and alkylene glycol alkyl ether esters, such as 1-methoxy-2-propanol-acetate (PGMEA).

Further, it is also possible to add other additives, such as adhesion promoters, crosslinking agents, colorants and plasticizers.

If desired, a minor amount of a sensitizer can be added for the purpose of rendering an acid generator for radiation sensitive from long-wavelength UV to a visible region. For this purpose, polycyclic aromatic compounds, such as pyrene and perylene, are preferred. Further, it is also possible to use dyes that can serve as a sensitizer.

A photoresist solution containing the radiation-sensitive mixture of the present invention is spin-coated on a suitable substrate, for example, a silicon wafer having an oxidized surface, to form a layer having a thickness of generally 0.1 to 5 μm, preferably in the range of from 0.5 to 1.5 μm, that is dried (for example, at a temperature of 70° to 130° C.) and imagewise irradiated by means of a suitable light source through a photomask. The radiation is particularly preferably a short-wavelength UV radiation (deep UV) in the wavelength range of from 200 to 300 nm. The light source is particularly preferably a KrF (248 nm) excimer laser. After imagewise irradiation, a baking treatment (post exposure bake) is effected at 40° to 90° C. for 180 to 30 sec. Baking at 60° C. for 60 sec is preferred. The photoresist is preferably developed with an alkaline developer not containing a metallic ion, for example, an aqueous tetramethylammonium hydroxide solution. When use is made of the aqueous tetramethylammonium hydroxide solution, the concentration is preferably in the range of from 1.0 to 4.0% by weight. The resolution is less than 0.5 μm. The irradiation energy necessary for the radiation-sensitive mixture of the present invention is generally in the range of from 5 to 100 mJ/cm².

If desired, the developed resist structure is cured. This is generally achieved by heating the resist structure on a hot plate at a temperature below the flow temperature (Fliesstemperatur) and subsequently irradiating the whole surface of the resist structure with a xenon-mercury vapor lamp (in a 200 to 250 nm region). Thereafter, the resist structure is crosslinked by curing, so that it exhibits flow resistance (Fliesstandigkeit) generally at a temperature up to 200° C.

The radiation-sensitive mixture of the present invention is preferably used as a resist material for the production of integrated circuits or various electronic components. In this case, the recording material produced from this mixture can be used as a mask in the subsequent step. Thereafter, for example, etching of the layer substrate, ion implantation into the layer substrate or metal separation is effected. Further, the radiation-sensitive mixture of the present invention is suitable also for the production of a lithography plate.

Process for Producing Propylene Glycol Monomethyl Ether Acetate (PGMEA) solution of Triphenylsulfonium Hydroxide A column having a length of 55 cm and an inner diameter of 5 cm was packed with 700 g of Amberlyst A-26 in a chloride form. In order to attain the purpose, the resin is dispersed in methanol and flowed into the column. 3 liters of methanol is added to 3 liters of a 0.54N tetramethylammonium hydroxide solution. The prepared column is converted to a hydroxide form with the alkaline solution.

The column is washed with 3 liters of methanol until the pH becomes neutral.

30 mmol (10.29 g) of triphenylsulfonium bromide is dissolved in a minor amount of methanol, and the solution is added to the column. The elution rate is 30 ml/hr. The elution is recorded by potentiometry or UV absorption. The base content is determined by titration with 0.1N HCl. A bromide ion test using silver nitrate is negative. From the determination of the content, it has been found that the percentage exchange was 99.8%. Methanol is evaporated in vacuo in a rotary evaporator and finally replaced with PGMEA until a 0.1N PGMEA solution of triphenylsulfonium hydroxide (TPSH) is provided.

The newly prepared TPSH solution is used in the formulation of a radiation-sensitive mixture. The base content of this solution is determined again 24 hr after the preparation. It was found that TPSH is completely converted to triphenylsulfonium acetate by the titration curve.

No change in TPSH concentration in the solution is observed when methanol is replaced with propylene glycol monomethyl ether.

Tri(4-methylphenyl)sulfonium hydroxide and tri(4-chlorophenyl)sulfonium hydroxide were produced in the same manner as that described above. TPSH was also produced using other sulfonium salt such as triphenylsulfonium trifluoromethane sulfonate.

EXAMPLE A

The following starting materials were used in the following examples of the first invention.

Polymer A:
Poly[4-hydroxystyrene-co-4-hydroxy-3-methylstyrene] (2:1 polymer):
$M_W$=14000 g/mol,
$M_N$=7000 g/mol and
optical density (248 nm)=0.18/µm$^{-1}$,
Poly-N,O-acetal B:
$R^1$=n-propyl,
$R^2$=ethylene,
$R^3$=aryl,
X=O—CO— and
n: $M_W$=2500 mol/g, $M_W/M_N$>2.5

Photo active compound C: bis (4-chlorophenylsulfonyl)diazomethane

Photo active compound D=bis(4-chlorophenylsulfonyl)methane

Photo active compound E: triphenylsulfonium triflate

Photo active compound F: tryphenylsulfonium heptafluoropropyl sulfonate

Solvent: 1-methoxy-propylene glycol-2-acetate (PGMEA)

Proportion of components of radiation-sensitive mixtures under test is expressed in parts by weight.

Examples A1 to A10

A radiation-sensitive mixture having the following composition was prepared.

| | |
|---|---|
| Polymer A | 1.40 parts by weight |
| Poly-N,O-acetal B | 0.70 part by weight |
| Photo active compound C,D,E,F | 0.04 part by weight (Table A) |
| Ammonium additive | 0.0 to 100 mol % to PAC (Table A) |
| PGMEA | 8.00 parts by weight |

This solution was filtered with a filter having a pore diameter of 0.2 µm, and the filtrate was spin-coated on a silicon wafer pretreated with hexamethyldisilazane as an adhesion promoter to form an even layer having a thickness of 1 µm. The coated wafer was dried (soft-baked) on a hot plate at 120° C. for 60 sec and then structured so that imagewise exposure could be effected. Irradiation was effected with a Canon excimer stepper having a numerical aperture of 0.37 through 248 nm KrF excimer laser irradiation by using test masks having various structures and dimensions. Holding time period between irradiation and subsequent baking (post exposure bake: PEB) and development is an important process parameter, and in these irradiation experiments, the holding time was less than 2 min unless otherwise specified. The post exposure bake was usually effected at 60° C. for 60 sec. The exposed wafer was developed by immersion in a 2.38 wt. % tetramethylammonium hydroxide solution (0.265N). The results were evaluated in terms of 1:1 resolution of lines and spaces (line/space structure).

In the holding time test, the period of time between the irradiation and PEB was varied, and the development was effected immediately after PEB. The results were evaluated in terms of line slimming of the resultant structure relative to the width of a structure provided at the same dose without the holding time.

These examples are summarized in the following table. In the table, "PAC" represents an photo active compound.

TABLE A

| Ex. No. | PAC 1 (pt. wt.) | PAC 2 (pt. wt.) | Ammonium additive | Proportion of ammonium additive concentration to total PAC concentration (mol/mol %) | 1:1 Dose for providing max. linear resolution (mJ/cm²) Max. linear resolution (μm) | Line slimming due to 30 min delay in period between exposure and PEB (%) |
|---|---|---|---|---|---|---|
| A1 | C 2 | None | None | None | 18 0.50 | 50 |
| A2 | C 2 | None | Tetramethylammonium hydroxide | 20 | 30 0.38 | 13 |
| A3 | C 2 | D 1 | Tetramethylammonium hydroxide | 40 | 48 0.32 | 10 |
| A4 | C 2 | D 1 | Trimethylphenylammonium hydroxide | 40 | 48 0.32 | 10 |
| A5 | C 2 | D 1 | Trimethylbenzylammonium hydroxide | 40 | 48 0.32 | 10 |
| A6 | C 2 | D 1 | Trimethyldodecyammonium hydroxide | 40 | 48 0.32 | 10 |
| A7 | C 2 | None | Tetrabutylammonium acetate | 50 | 45 0.32 | 10 |
| A8 | C 3 | None | Tetrabutylammonium hydroxide | 50 | 41 0.30 | 10 |
| A9 | E 2 | None | Tetrabutylammonium hydroxide | 100 | 30 0.30 | 10 |
| A10 | F 3 | None | Tetrabutylammonium hydroxide | 100 | 30 0.30 | 10 |

Example A11

A radiation-sensitive mixture having the following composition was prepared.

| | |
|---|---|
| Polyhydroxystyrene of which the phenolic OH group was substituted by 40% with a tert-butyloxycarbonyl group | 2.00 parts by weight |
| Photo active compound E | 0.05 part by weight |
| PGMEA | 8.00 parts by weight |
| Tetrabutylammonium hydroxide as 0.1 mmol/g PGMEA solution (50% by mole based on the amount of compound E in the resist) | 50% |

This solution was filtered with a filter having a pore diameter of 0.2 μm, and the filtrate was spin-coated on a silicon wafer pretreated with hexamethyldisilazane as an adhesion promoter to form an even layer having a thickness of 1 μm. The coated wafer was dried (soft-baked) on a hot plate at 120° C. for 60 sec and then structured so that imagewise exposure could be effected, Irradiation was effected with a Canon excimer stepper having a numerical aperture of 0.37 through 248 nm KrF excimer laser irradiation by using test masks having various structures and dimensions. Holding time period between irradiation and subsequent baking (post exposure bake: PEB) and development is an important process parameter, and in these irradiation experiments, the holding time was less than 2 min unless otherwise specified. The post exposure bake was usually effected at 90° C. for 60 sec. The exposed wafer was developed by immersion in a tetramethylammonium hydroxide solution (0.15N). The resolution of the resist material was evaluated in the same manner as that of the above examples. As a result, it has been found that the same improvement as attained in the above examples could be attained.

Example A12

A radiation-sensitive mixture having the following composition was prepared.

| | |
|---|---|
| Polyhydroxystyrene of which the phenolic OH group was substituted by 40% with a trimethylsilyl group | 2.00 parts by weight |
| Photo active compound E | 0.05 part by weight |
| PGMEA | 8.00 parts by weight |
| Tetrabutylammonium hydroxide as 0.1 mmol/g PGMEA solution (50% by mole based on the amount of compound E in the resist) | 50% |

This solution was filtered with a filter having a pore diameter of 0.2 μm, and the filtrate was spin-coated on a silicon wafer pretreated with hexamethyldisilazane as an adhesion promoter to form an even layer having a thickness of 1 μm. The coated wafer was dried (soft-baked) on a hot plate at 120° C. for 60 sec and then structured so that imagewise exposure could be effected. Irradiation was effected with a Canon excimer stepper having a numerical aperture of 0.37 through 248 nm KrF excimer laser irradiation by using test masks having various structures and dimensions. Holding time period between irradiation and subsequent baking (baking after exposure: PEB) and development is an important process parameter, and in these irradiation experiments, the holding time was less than 2 min unless otherwise specified. The post exposure bake was usually effected at 70° C. for 60 sec. The exposed wafer was developed by immersion in a tetramethylammonium hydroxide solution (0.15N). The resolution of the resist material was evaluated in the same manner as that of the above examples. As a result, it has been found that the same improvement as attained in the above examples could be attained.

Example A13

A radiation-sensitive mixture having the following composition was prepared.

| | |
|---|---|
| Polyhydroxystyrene of which the phenolic OH group was substituted by 40% with a tetrahydropyranyl group | 2.00 parts by weight |
| Photo active compound E | 0.05 part by weight |
| PGMEA | 8.00 parts by weight |
| Tetrabutylammonium hydroxide as 0.1 mmol/g PGMEA solution (50% by mole based on the amount of compound E in the resist) | 50% |

This solution was filtered with a filter having a pore diameter of 0.2 μm, and the filtrate was spin-coated on a silicon wafer pretreated with hexamethyldisilazane as an adhesion promoter to form an even layer having a thickness of 1 μm. The coated wafer was dried (soft-baked) on a hot plate at 120° C. for 60 sec and then structured so that imagewise exposure could be effected. Irradiation was effected with a Canon excimer stepper having a numerical aperture of 0.37 through 248 nm KrF excimer laser irradiation by using test masks having various structures and dimensions. Holding time period between irradiation and subsequent baking (post exposure bake: PEB) and development is an important process parameter, and in these irradiation experiments, the holding time was less than 2 min unless otherwise specified. The post exposure bake was usually effected at 70° C. for 60 sec. The exposed wafer was developed by immersion in a tetramethylammonium hydroxide solution (0.15N). The resolution of the resist material was evaluated in the same manner as that of the above examples. As a result, it has been found that the same improvement as attained in the above examples could be attained.

Example A14

A radiation-sensitive mixture having the following composition was prepared.

| | |
|---|---|
| Polyhydroxystyrene of which the phenolic OH group was substituted by 40% with a tert-butyl ester group | 2.00 parts by weight |
| Photo active compound E | 0.05 part by weight |
| PGMEA | 8.00 parts by weight |
| Tetrabutylammonium hydroxide as 0.1 mmol/g PGMEA solution (50% by mole based on the amount of compound E in the resist) | 50% |

This solution was filtered with a filter having a pore diameter of 0.2 μm, and the filtrate was spin-coated on a silicon wafer pretreated with hexamethyldisilazane as an adhesion promoter to form an even layer having a thickness of 1 μm. The coated wafer was dried (soft-baked) on a hot plate at 120° C. for 60 sec and then structured so that imagewise exposure could be effected. Irradiation was effected with a Canon excimer stepper having a numerical aperture of 0.37 through 248 nm KrF excimer laser irradiation by using test masks having various structures and dimensions. Holding time period between irradiation and subsequent baking (post exposure bake: PEB) and development is an important process parameter, and in these irradiation experiments, the holding time was less than 2 min unless otherwise specified. The post exposure bake was usually effected at 90° C. for 60 sec. The exposed wafer was developed by immersion in a tetramethylammonium hydroxide solution (0.15N). The resolution of the resist material was evaluated in the same manner as that of the above examples. As a result, it has been found that the same improvement as attained in the above examples could be attained.

Example A15

A radiation-sensitive mixture having the following composition was prepared.

| | |
|---|---|
| Polymer A | 1.60 parts by weight |
| Terephthaldehyde-tetrakis-phenoxyethylacetal | 0.40 part by weight |
| Photo active compound E | 0.05 part by weight |
| PGMEA | 8.00 parts by weight |
| Tetrabutylammonium hydroxide as 0.1 mmol/g PGMEA solution (50% by mole based on the amount of compound E in the resist) | 30% |

This solution was filtered with a filter having a pore diameter of 0.2 μm, and the filtrate was spin-coated on a silicon wafer pretreated with hexamethyldisilazane as an adhesion promoter to form an even layer having a thickness of 1 μm. The coated wafer was dried (soft-baked) on a hot plate at 120° C. for 60 sec and then structured so that imagewise exposure could be effected. Irradiation was effected with a Canon excimer stepper having a numerical aperture of 0.37 through 248 nm KrF excimer laser irradiation by using test masks having various structures and dimensions. Holding time period between irradiation and subsequent baking (post exposure bake: PEB) and development is an important process parameter, and in these irradiation experiments, the holding time was less than 2 min unless otherwise specified. The post exposure bake was usually effected at 60° C. for 60 sec. The exposed wafer was developed by immersion in a tetramethylammonium hydroxide solution (0.27N). The resolution of the resist material was evaluated in the same manner as that of the above examples. As a result, it has been found that the same improvement as attained in the above examples could be attained.

Example A≠

A radiation-sensitive mixture having the following composition was prepared.

| | |
|---|---|
| Polymer A | 1.60 parts by weight |
| Phenoxyethyl orthoester of benzoic acid | 0.40 part by weight |
| Photo active compound E | 0.05 part by weight |
| PGMEA | 8.00 parts by weight |

-continued

| | |
|---|---|
| Tetrabutylammonium hydroxide as 0.1 mmol/g PGMEA solution (50% by mole based on the amount of compound E in the resist) | 30% |

This solution was filtered with a filter having a pore diameter of 0.2 μm, and the filtrate was spin-coated on a silicon wafer pretreated with hexamethyldisilazane as an adhesion promoter to form an even layer having a thickness of 1 μm. The coated wafer was dried (soft-baked) on a hot plate at 120° C. for 60 sec and then structured so that imagewise exposure could be effected. Irradiation was effected with a Canon excimer stepper having a numerical aperture of 0.37 through 248 nm KrF excimer laser irradiation by using test masks having various structures and dimensions. Holding time period between irradiation and subsequent baking (post exposure bake: PEB) and development is an important process parameter, and in these irradiation experiments, the holding time was less than 2 min unless otherwise specified. The post exposure bake was usually effected at 60° C. for 60 sec. The exposed wafer was developed by immersion in a tetramethylammonium hydroxide solution (0.27N). The resolution of the resist material was evaluated in the same manner as that of the above examples. As a result, it has been found that the same improvement as attained in the above examples could be attained.

Example B

In the following examples of the second invention, use was made of the same starting compounds as those used in Example A.

Proportion of components of radiation-sensitive mixtures under test is expressed in parts by weight.

Examples B1 to B10

A radiation-sensitive mixture having the following composition was prepared.

| | |
|---|---|
| Polymer A | 1.40 parts by weight |
| Poly-N,O-acetal B | 0.70 part by weight |
| Photo active compound C,D,E,F | 0.04 part by weight (Table B) |
| Sulfonium additive | 0 to 100 mol % to PAC (Table B) |
| PGMEA | 8.00 parts by weight |

This solution was filtered with a filter having a pore diameter of 0.2 μm, and the filtrate was spin-coated on a silicon wafer pretreated with hexamethyldisilazane as an adhesion promoter to form an even layer having a thickness of 1 μm. The coated wafer was dried (soft-baked) on a hot plate at 120° C. for 60 sec and then structured so that imagewise exposure could be effected. Irradiation was effected with a Canon excimer stepper having a numerical aperture of 0.37 through 248 nm KrF excimer laser irradiation by using test masks having various structures and dimensions. Holding time period between irradiation and subsequent baking (post exposure bake: PEB) and development is an important process parameter, and in these irradiation experiments, the holding time was less than 2 min unless otherwise specified. The post exposure bake was usually effected at 60° C. for 60 sec. The exposed wafer was developed by immersion in a 2.38 wt. % tetramethylammonium hydroxide solution (0.265N). The results of lithographic printing were evaluated in terms of 1:1 resolution of lines and spaces (line/space structure).

In the holding time test, the period of time between the irradiation and PEB was varied, and the development was effected immediately after PEB. The results were evaluated in terms of line slimming of the resultant structure relative to the width of a structure provided at the same dose without the holding time.

These examples are summarized in the following table. In the table, "PAC" represents an photo active compound.

TABLE B

| Ex. No. | PAC 1 (pt. wt.) | PAC 2 (pt. wt.) | As 0.1 mmol/g solution in basic sulfonium additive PGMEA | Proportion of concentration of sulfonium additive to concentration of total PAC concentration | 1:1 Dose for providing max. linear resolution (mJ/cm$^2$) Max. linear resolution (μm) | Line slimming due to 30 min delay in period between exposure and PEB (%) |
|---|---|---|---|---|---|---|
| B1 | C 2 | None | None | None | 18 0.50 | 50 |
| B2 | C 2 | None | Triphenylsulfonium hydroxide | 20 | 25 0.38 | 15 |
| B3 | C 2 | None | Triphenylsulfonium hydroxide | 40 | 33 0.34 | 12 |
| B4 | C 2 | None | Triphenylsulfonium hydroxide | 60 | 48 0.32 | 9 |
| B5 | C 4 | None | Triphenylsulfonium hydroxide | 60 | 65 0.30 | 7 |
| B6 | C 2 | None | Tri(methylphenyl)sulfonium hydroxide | 50 | 30 0.32 | 8 |
| B7 | C 2 | E 1 | Triphenylsulfonium hydroxide | 50 | 25 0.30 | 8 |
| B8 | C 2 | D 2 | Triphenylsulfonium hydroxide | 40 | 68 0.30 | 9 |
| B9 | E 2 | None | Triphenylsulfonium hydroxide | 100 | 25 0.30 | 10 |
| B10 | F | None | Triphenylsulfonium | 100 | 30 | 10 |

TABLE B-continued

| Ex. No. | PAC 1 (pt. wt.) | PAC 2 (pt. wt.) | As 0.1 mmol/g solution in basic sulfonium additive PGMEA | Proportion of concentration of sulfonium additive to concentration of total PAC concentration | 1:1 Dose for providing max. linear resolution (mJ/cm$^2$) Max. linear resolution (μm) | Line slimming due to 30 min delay in period between exposure and PEB (%) |
|---|---|---|---|---|---|---|
| | 2 | | hydroxide | | 0.30 | |

Example B11

A radiation-sensitive mixture having the following composition was prepared.

| | |
|---|---|
| Polyhydroxystyrene of which the phenolic OH group was substituted by 40% with a tert-butyloxycarbonyl group | 2.00 parts by weight |
| Photo active compound E | 0.05 part by weight |
| PGMEA | 8.00 parts by weight |
| TPSH as 0.1 mmol/g PGMEA solution (50% by mole based on the amount of compound E in the resist) | 50% |

This solution was filtered with a filter having a pore diameter of 0.2 μm, and the filtrate was spin-coated on a silicon wafer pretreated with hexamethyldisilazane as an adhesion promoter to form an even layer having a thickness of 1 μm. The coated wafer was dried (soft-baked) on a hot plate at 120° C. for 60 sec and then structured so that imagewise exposure could be effected. Irradiation was effected with a Canon excimer stepper having a numerical aperture of 0.37 through 248 nm KrF excimer laser irradiation by using test masks having various structures and dimensions. Holding time period between irradiation and subsequent baking (post exposure bake: PEB) and development is an important process parameter, and in these irradiation experiments, the holding time was less than 2 min unless otherwise specified. The post exposure bake was usually effected at 90° C. for 60 sec. The exposed wafer was developed by immersion in a tetramethylammonium hydroxide solution (0.15N). The resolution of the resist material was evaluated in the same manner as that of the above examples. As a result, it has been found that the same improvement as attained in the above examples could be attained.

Example B12

A radiation-sensitive mixture having the following composition was prepared.

| | |
|---|---|
| Polyhydroxystyrene of which the phenolic OH group was substituted by 40% with a trimethylsilyl group | 2.00 parts by weight |
| Photo active compound E | 0.05 part by weight |
| PGMEA | 8.00 parts by weight |
| TPSH as 0.1 mmol/g PGMEA solution (50% by mole based on the amount of compound E in the resist) | 50% |

This solution was filtered with a filter having a pore diameter of 0.2 μm, and the filtrate was spin-coated on a silicon wafer pretreated with hexamethyldisilazane as an adhesion promoter to form an even layer having a thickness of 1 μm. The coated wafer was dried (soft-baked) on a hot plate at 120° C. for 60 sec and then structured so that imagewise exposure could be effected. Irradiation was effected with a Canon excimer stepper having a numerical aperture of 0.37 through 248 nm KrF excimer laser irradiation by using test masks having various structures and dimensions. Holding time period between irradiation and subsequent baking (post exposure bake: PEB) and development is an important process parameter, and in these irradiation experiments, the holding time was less than 2 min unless otherwise specified. The post exposure bake was usually effected at 70° C. for 60 sec. The exposed wafer was developed by immersion in a tetramethylammonium hydroxide solution (0.15N). The resolution of the resist material was evaluated in the same manner as that of the above examples. As a result, it has been found that the same improvement as attained in the above examples could be attained.

Example B13

A radiation-sensitive mixture having the following composition was prepared.

| | |
|---|---|
| Polyhydroxystyrene of which the phenolic OH group was substituted by 40% with a tetrahydropyranyl group | 2.00 parts by weight |
| Photo active compound E | 0.05 part by weight |
| PGMEA | 8.00 parts by weight |
| TPSH as 0.1 mmol/g PGMEA solution (50% by mole based on the amount of compound E in the resist) | 50% |

This solution was filtered with a filter having a pore diameter of 0.2 μm, and the filtrate was spin-coated on a silicon wafer pretreated with hexamethyldisilazane as an adhesion promoter to form an even layer having a thickness of 1 μm. The coated wafer was dried (soft-baked) on a hot plate at 120° C. for 60 sec and then structured so that imagewise exposure could be effected. Irradiation was effected with a Canon excimer stepper having a numerical aperture of 0.37 through 248 nm KrF excimer laser irradiation by using test masks having various structures and dimensions. Holding time period between irradiation and subsequent baking (post exposure bake: PEB) and development is an important process parameter, and in these irradiation experiments, the holding time was less than 2 min unless otherwise specified. The post exposure bake was usually effected at 70° C. for 60 sec. The exposed wafer was developed by immersion in a tetramethylammonium hydroxide solution (0.15N). The resolution of the resist material was evaluated in the same manner as that of the above examples. As a result, it has been found that the same improvement as attained in the above examples could be attained.

Example 14

A radiation-sensitive mixture having the following composition was prepared.

| | |
|---|---|
| Polyhydroxystyrene of which the phenolic OH group was substituted by 40% with a tert-butyl ester group | 2.00 parts by weight |
| Photo active compound E | 0.05 part by weight |
| PGMEA | 8.00 parts by weight |
| TPSH as 0.1 mmol/g PGMEA solution (50% by mole based on the amount of compound E in the resist) | 50% |

This solution was filtered with a filter having a pore diameter of 0.2 μm, and the filtrate was spin-coated on a silicon wafer pretreated with hexamethyldisilazane as an adhesion promoter to form an even layer having a thickness of 1 μm. The coated wafer was dried (soft-baked) on a hot plate at 120° C. for 60 sec and then structured so that imagewise exposure could be effected. Irradiation was effected with a Canon excimer stepper having a numerical aperture of 0.37 through 248 nm KrF excimer laser irradiation by using test masks having various structures and dimensions. Holding time period between irradiation and subsequent baking (post exposure bake: PEB) and development is an important process parameter, and in these irradiation experiments, the holding time was less than 2 min unless otherwise specified. The post exposure bake was usually effected at 90° C. for 60 sec. The exposed wafer was developed by immersion in a tetramethylammonium hydroxide solution (0.15N). The resolution of the resist material was evaluated in the same manner as that of the above examples. As a result, it has been found that the same improvement as attained in the above examples could be attained.

We claim:

1. A positive-working radiation-sensitive mixture comprising, as indispensable components, in admixture:
    a) a binder insoluble in water but soluble in an aqueous alkaline solution, in an amount sufficient so that the mixture forms a uniform coating,
    b) a compound having at least one bond cleavable with an acid,
    c) a compound capable of producing an acid upon radiation, and
    $d_1$) a basic ammonium compound or $d_2$) a basic sulfonium compound, wherein components b), c) are present in amounts sufficient to produce a latent image when a layer of the mixture is exposed to actinic radiation, and compound $d_1$ or $d_2$ is present in an amount sufficient to stabilize the latent image by neutralizing acid that diffuses from exposed areas into nonexposed areas when a layer of the mixture is exposed to actinic radiation.

2. A positive-working radiation-sensitive mixture according to claim 1, wherein said compound b) is a compound having at least one C—O—C or C—N—C bond cleavable with an acid.

3. A positive-working radiation-sensitive mixture according to claim 1, wherein the content of the basic ammonium compound as the component $d_1$) is 0.01 to 1.00 molar equivalent based on the maximum amount of an acid theoretically produceable from the compound c).

4. A positive-working radiation-sensitive mixture according to claim 1, wherein said basic ammonium compound as the component $d_1$) is a compound represented by the following general formula I:

$$[NR^1R^2R^3R^4]^+X_1^- \qquad I$$

wherein $R^1$ to $R^4$ each independently represent a $C_1$–$C_{18}$ alkyl, cycloalkyl, alkylaryl or aryl group, provided that one or more aliphatic $CH_2$ group thereof may be substituted with an oxygen atom; and $X_1$ represents a basic anion having a $pK_B$ value of −3 to +5.

5. A positive-working radiation-sensitive mixture according to claim 1, wherein said basic ammonium compound $d_1$) is a compound represented by the following general formula I:

$$[NR^1R^2R^3R^4]^+X_1^- \qquad I$$

wherein $R^1$ to $R^4$ each independently represent methyl, ethyl, propyl, isopropyl, butyl, dodecyl, phenyl or benzyl; and $X_1$ represents a hydroxyl group or OR' (wherein R' represents a $C_1$–$C_4$ alkyl), OCOR" (wherein R" represents a $C_1$–$C_{10}$ alkyl or aryl) or OCOO—.

6. A positive-working radiation-sensitive mixture according to claim 1, wherein the content of the basic sulfonium compound as the component $d_2$) is 0.01 to 2.00 molar equivalent based on the maximum amount of an acid theoretically produceable from the compound c).

7. A positive-working radiation-sensitive mixture according to claim 1, wherein said basic sulfonium compound as the component $d_2$) is a member selected from the group consisting of compounds represented by the following formulae II to V:

$$SR^5R^6R^7]^+X_2^- \qquad II$$

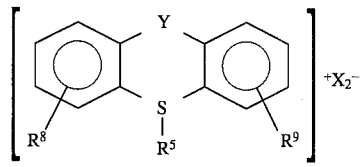

-continued

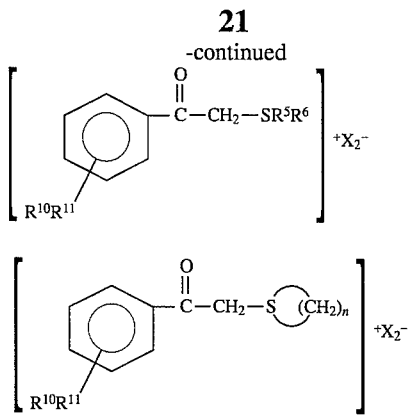

wherein $R^5$, $R^6$ and $R^7$ each independently represent a $C_1$–$C_{18}$ alkyl, aryl or heteroaryl group or an aryl group mono-, di- or tri-substituted with an alkyl, an alkylaryl, an aryl, a halogen, an alkoxy, a phenoxy, a thiophenol, a phenylsulfonyl or a phenylsulphenyl;

Y represents $[CH_2]_n$ wherein n is 0 or 1, O or S;

$R^8$ and $R^9$ represent a $C_1$–$C_4$ alkyl, alkoxy or a halogen;

$R^{10}$ and $R^{11}$ represent a $C_1$–$C_4$ alkyl, alkoxy or a halogen;

n is 5 or 6; and $X_2$ represents a basic anion having a $pK_B$ value of −3 to +5.

8. A positive-working radiation-sensitive mixture according to claim 1, wherein said basic sulfonium compound as the component $d_2$) is a member selected from the group consisting of compounds represented by the following formulae II to V:

$$[SR^5R^6R^7]+X_2^{-} \quad II$$

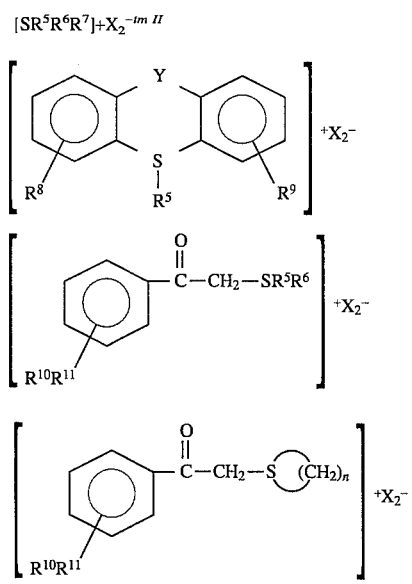

wherein $R^5$, $R^6$ and $R^7$ each independently represent methyl, ethyl, propyl, isopropyl, butyl, phenyl, benzylbiphenyl, tolyl, xylyl, chlorophenyl, bromophenyl, methoxyphenyl, ethoxyphenyl, propyloxyphenyl, butyloxyphenyl, tert-butyloxyphenyl, phenoxyphenyl, thiophenoxyphenyl or phenylsulfonylphenyl;

Y represents $[CH_2]_n$ wherein n is 0 or 1, O or S;

$R^8$ and $R^9$ represent a $C_1$–$C_4$ alkyl, methoxy, ethoxy, chlorine or bromine;

$R^{10}$ and $R^{11}$ represent a $C_1$–$C_4$ alkyl, methoxy, ethoxy, chlorine or bromine;

n is 5 or 6; and $X_2$ represents a hydroxyl group or OR (wherein R represents a $C_1$–$C_4$ alkyl), OCOR (wherein R represents a $C_1$–$C_{10}$ alkyl, aryl or alkylaryl) or OCOO—.

9. A positive-working radiation-sensitive mixture according to claim 1, wherein said binder as component a) contains a phenolic hydroxyl group.

10. A positive-working radiation-sensitive mixture according to claim 1, wherein said binder as the component a) comprises polyvinyl phenol, an alkyl-substituted polyvinyl phenol or its copolymer.

11. A positive-working radiation-sensitive mixture according to claim 1, wherein said binder as the component a) comprises another phenolic binder besides polyvinyl phenol.

12. A positive-working radiation-sensitive mixture according to claim 1, wherein said compound as the component b) is a compound represented by the following general formula VI:

$$[CH-O-R^{12}-Z-N-]_n \quad VI$$
$$\phantom{[CH}|\phantom{-O-R^{12}-Z-}|$$
$$\phantom{[}R^{14}\phantom{-O-R^{12}-Z}R^{13}$$

wherein $R_{12}$ represents a $C_1$–$C_4$ alkylene group, $R_{13}$ represents a $C_1$–$C_4$ alkyl group, $R_{14}$ represents a $C_1$–$C_{10}$ alkyl or aryl group, Z represents a group selected from the group consisting of —CO—, —O—CO— or —NH—CO—, and n is an integer exceeding 1.

13. A positive-working radiation-sensitive mixture according to claim 1, wherein the concentration of said compound as the component b) is 1 to 60% by weight.

14. A positive-working radiation-sensitive mixture according to claim 1, wherein said compound as the component c) produces a sulfonic acid upon being photodecomposed.

15. A positive-working radiation-sensitive mixture according to claim 1, wherein said compound as the component c) is an α,α-bis-sulfonyldiazomethane derivative represented by the following general formula VII:

$$R-SO_2-C-SO_2-R' \quad VII$$
$$\phantom{R-SO_2-}\|$$
$$\phantom{R-SO_2-}N_2$$

wherein R and R' represent an alkyl, cycloalkyl, aryl, halogenated aryl or heteroaryl group.

16. A positive-working radiation-sensitive mixture according to claim 1, wherein said compound as the component c) is a sulfonium salt, an α,α-bis-sulfonyldiazomethane derivative or a phenolic sulfonic ester.

17. A positive-working radiation-sensitive mixture according to claim 1, wherein the concentration of said compound as the component c) in said mixture is up to 10% by weight.

18. A positive-working radiation-sensitive mixture according to claim 1, wherein said compound as the component c) is a salt of sulfonium-sulfonate produced by adding a sulfonic acid to a basic sulfonium salt.

19. A positive-working radiation-sensitive mixture according to claim 18, wherein said sulfonic acid is an alkylsulfonic acid, a partially or entirely fluorinated alkylsulfonic acid, an arylsulfonic acid or an arylsulfonic acid substituted with a halogen, an alkyl, an alkoxy, nitro, cyano or an alkyl halide.

20. A radiation-sensitive recording material comprising a layer substrate and a radiation-sensitive layer, wherein said radiation-sensitive layer comprises a radiation-sensitive mixture according to claim 1.

* * * * *